METHOD OF MAKING SEMICONDUCTOR DEVICES

Original Filed Jan. 14, 1963

INVENTOR.
Robert G. Hays

BY Mueller & Aichele

ATTY'S.

3,271,851
Patented Sept. 13, 1966

3,271,851
METHOD OF MAKING SEMICONDUCTOR DEVICES

Robert G. Hays, Scottsdale, Ariz., assignor to Motorola, Inc., Franklin Park, Ill., a corporation of Illinois Continuation of application Ser. No. 251,421, Jan. 14, 1963. This application June 7, 1965, Ser. No. 461,936
7 Claims. (Cl. 29—492)

This application is a continuation of the application filed January 14, 1963, Serial No. 251,421, now abandoned.

This invention relates generally to semiconductor devices, and particularly to a method of making electrical connections to silicon crystal elements in the fabrication of semiconductor devices.

The semiconductor unit of certain rectifiers and diodes consists of a single crystal element of silicon which has an internal PN junction and has plated metal contacts at surfaces parallel to the PN junction. Electrical connectors are soldered to the metal coatings, and often one of the connectors is part of a housing which forms an enclosure for the semiconductor unit. The metal coatings have been required because available solder materials do not wet silicon well enough to permit soldering the connectors directly to the silicon material.

It has usually been necessary to apply more than one metal coating to the silicon material. In one process, a first nickel coating has been deposited on the silicon wafers by dipping them in a nickel plating bath of the electroless type. The wafers have then been heated to improve the adherence of the nickel. A second nickel coating has been applied over the first one, and then gold has been plated over the nickel, all by immersing the wafers in plating baths, with suitable rinsing and drying procedures being carried out between the plating steps. This rather elaborate wet chemical processing represents a substantial part of the cost of manufacturing the semiconductor devices. Furthermore, the coatings sometimes contain contaminants, derived from the plating baths, which can degrade the electrical characteristics of the devices. Such contamination sometimes makes the reverse leakage current of rectifiers higher than is desired.

Accordingly, it is an object of this invention to simplify the processing involved in making electrical connections to semiconductor elements of silicon by eliminating wet chemical plating steps from that processing.

Another object of the invention is to provide an improved method of making soldered electrical connections to silicon material of semiconductor elements such that the connections are reliable mechanically and electrically.

A further object of the invention is to reduce contamination of silicon crystal elements for semiconductor devices in order to improve the leakage current parameters of such devices.

A feature of this invention is the provision of a process for making an electrical connection to a semiconductor element in which a thin film of nickel deposited from nickel carbonyl is used as a wetting agent to permit soldering a metal connector directly to a silicon element.

Another feature of this invention is the provision of a process for making an electrical connection to a semiconductor element in which the semiconductor element is heated in one zone of a confined space and exposed to gaseous nickel carbonyl in a second zone of said confined space.

Another feature of this invention is the provision of a process for making an electrical connection to a semiconductor element in which the gaseous nickel carbonyl is prevented from entering the hot zone of the confined space by a flow of a gas, inert with respect to nickel carbonyl, in a direction opposite to the flow of the nickel carbonyl gas.

Another feature of this invention is the provision of a process for making an electrical connection to a semiconductor element in which the thin film of nickel deposited from nickel carbonyl is between 1 and 20 microinches in thickness.

The invention will be described with reference to the accompanying drawings, in which.

Figures 1, 2, 3, 4:
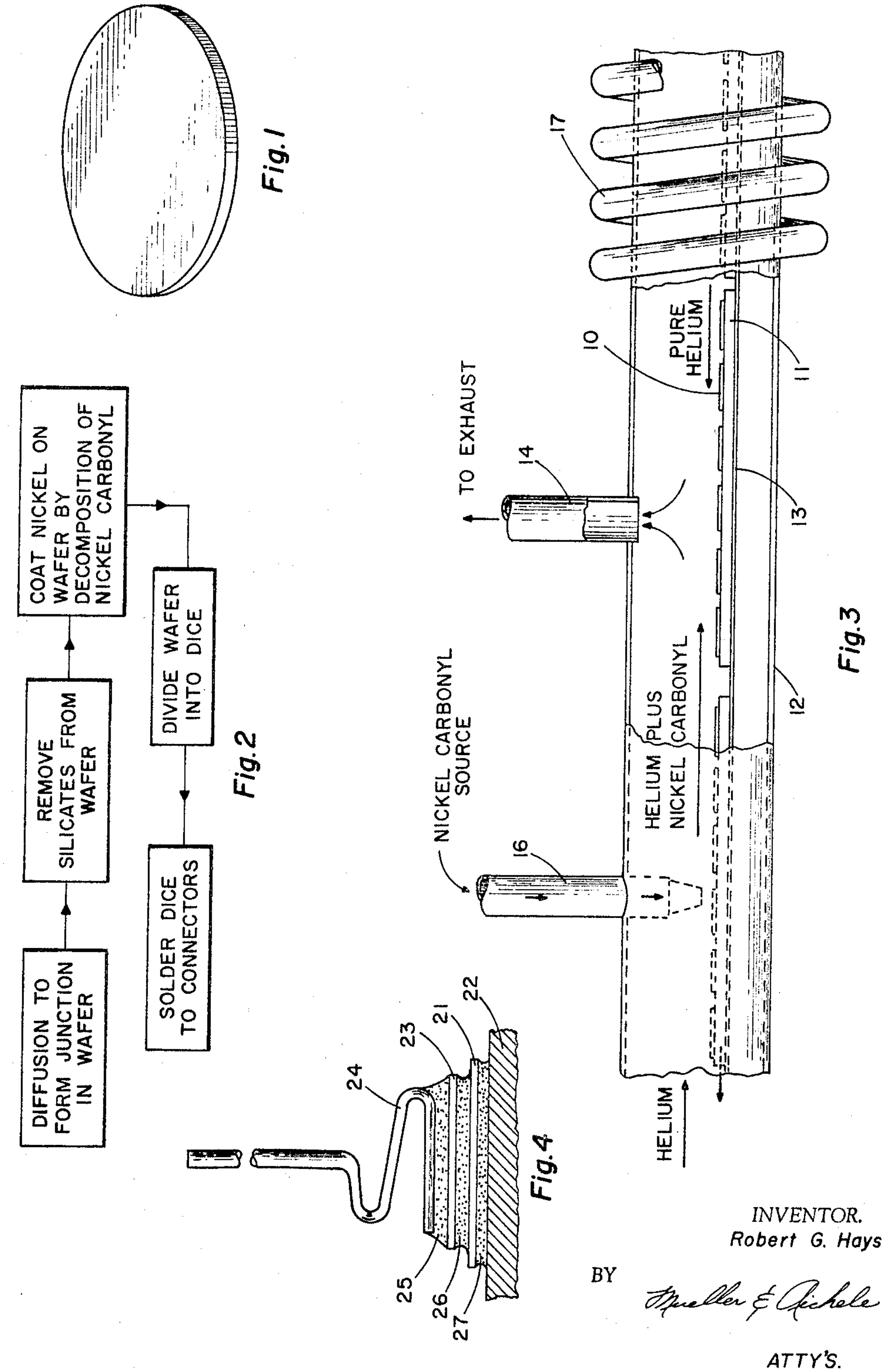
FIG. 1 shows a silicon crystal element in the form of a wafer which constitutes the starting material for the method of the invention.
FIG. 2 is a flow diagram of a process for fabricating such wafers into semiconductor devices.

FIG. 3 illustrates part of a gas plating system which may be used to accomplish the gas plating step of the fabrication process; and In a particular process embodiment of the invention, silicon wafers of the diffused junction type are treated to remove silicon oxides and/or silicates from their surfaces in order to expose the underlying silicon. The wafers are then placed in a gas plating system where they are heated and exposed to a gaseous atmosphere containing nickel carbonyl which decomposes to deposit nickel on the wafers. An extremely thin film of nickel is formed on the wafers in this gas plating step, and its function is to act as a wetting agent for solder in a subsequent soldering step. After the gas plating step, the wafers are divided into semiconductor units, and these units are assembled with connector structures and solder material and are passed through a soldering furnace. The solder bonds directly to the silicon material, and no fluxing other than that provided by the nickel film is required. Even though the silicon is coated with only a thin film of nickel, unusually good wetting of the units by the solder is obtained. A nickel coating applied to silicon units from nickel carbonyl vapors makes the silicon easily wetted by most solders, and yet contains less contamination than platings applied from solutions which have typically been used in the semiconductor art.

Silicon material for fabrication into semiconductor rectifiers may be prepared by any of several known processes. In one such process, a silicon crystal is grown and then sliced into thin, flat wafers. The wafers are lapped, polished and otherwise processed until they are of the desired thickness and have smooth, clean surfaces. Such wafers are typically 8 to 12 mils thick. A typical wafer 10 of this type is shown in FIG. 1.

FIG. 2 is a flow diagram showing the steps of a process for fabricating the wafer 10 into semiconductor devices. First, a diffusion step is carried out in order to form a PN junction in the wafer, and also to form low resistivity regions at the surfaces of the silicon material. Such diffusion processing is well-known in the semiconductor art and will not be described in complete detail. In a typical process, phosphorus is diffused into one side of the wafer and boron is diffused into the opposite side of the wafer. An organic solution containing boron oxide ($B_2O_3$) may be painted on one side of the wafer, and another organic solution containing phosphorus pentoxide ($P_2O_5$) may be painted on the opposite side of the wafer to form coatings which act as sources of boron and phosphorus in the diffusion step. A number of the wafers are then placed in a diffusion furnace and heated in a gaseous atmosphere, usually oxygen, at a temperature of about 1300° C. in order to diffuse boron and phosphorus into the wafers.

If the starting material in N type silicon, the boron-diffused region forms a PN junction with the bulk material of the wafer, and the phosphorus-diffused region forms a low resistance connection to the bulk material. If the starting material is of P type silicon, the rectifying junction is formed at the phosphorus-diffused region, and a low resistance connection is formed at the boron-diffused region.

During the diffusion step, glassy silicate layers form on the surfaces of the wafer. There is a layer of boro-silicate glass on one side of the wafer and a layer of phospho-silicate glass on the other side of the wafer. Several suitable treatments for removing these silicate materials are known in the art. In one treatment, the wafers are soaked in hydrofluoric acid for at least fifteen minutes, then rinsed, and dipped briefly in an etching solution which removes a small amount of silicon from the wafers. A suitable etching solution is composed of five parts nitric acid, one part hydrofluoric acid, and four parts acetic acid. Another suitable etching solution is a hot aqueous solution of an alkali metal hydroxide. For some applications, it is satisfactory to soak the wafers in hydrofluoric acid, and then sandblast the wafers to expose the silicon. If the wafers are ultimately to be divided into semiconductor units by scribing and breaking techniques, the two step etching treatment is preferred since sandblasted wafers are more likely to shatter when scribed.

In accordance with the invention, the wafers are next coated with a very thin film of nickel by a gas plating step in which nickel carbonyl is thermally decomposed to deposit nickel on the wafers. FIG. 3 is a schematic drawing of a suitable system for carrying out the gas plating step in a continuous manner. A number of wafers 10 are placed on carriers 11 which are moved through a tube 12 on a conveyor 13. The carriers and also the tube 12 may be made of glass. As viewed in FIG. 3, the carriers 11 with the wafers on them move through the tube 12 from right to left. Gas flows from both ends of the tube 12 to an exhaust outlet 14 which in FIG. 3 is located near the center of the tube. The tube 12 should be sealed from room atmosphere, and this can be accomplished by providing an air lock at each end of the tube. Gases which are exhausted through the outlet 14 are burned before venting them to the atmosphere. Part of the exhaust gases may be recirculated through the system if desired.

Gaseous nickel carbonyl is supplied to the system through an inlet 16. The nickel carbonyl is carried in a stream of gas, and may be introduced into such gas in standard bubbler apparatus. The carrier gas, and the gas introduced at the ends of the tube, should be inert with respect to nickel carbonyl, and suitable gases are helium, argon and carbon dioxide.

The nickel carbonyl gas stream entering through the inlet 16 mixes with the inert gas flowing from the left end of the tube, and the mixed gases flow to the outlet 14. Thus, as viewed in FIG. 3, nickel carbonyl vapors are present in a portion of the tube to the left of the exhaust outlet 14, and substantially pure inert gas is present in the portion of the tube to the right of the outlet 14. The wafers 10 are heated while they move through the right-hand portion of the tube. A resistance heating coil 17 has been shown in FIG. 3 by way of example, but inductive heating or infrared heating may be employed if desired.

The wafers remain hot as they move along the tube, and the glass carriers help to keep the wafers hot since the carriers lose heat more slowly than the wafers. In the left-hand portion of the tube, nickel carbonyl is decomposed by heat from the wafers. The decomposition products are nickel and carbon monoxide. The nickel deposits on the wafers, and the carbon monoxide gas is exhausted through the outlet 14. After nickel has been plated on one side of the wafers, they are turned over and run through the system again to plate nickel on the other side.

As previously mentioned, the nickel film on the wafers should be very thin in order to obtain reliable bonding of solder to the underlying silicon material. In order to obtain satisfactory soldering, it has been necessary to limit the thickness of the nickel film to a value of from 1 to 20 microinches. The best results for soldering purposes have been obtained with a nickel thickness of about 5 microinches.

For the equipment shown in FIG. 3, the variables which affect the thickness of the nickel plating are the speed of the conveyor 13, the temperature to which the wafers 10 are exposed at the heater coil 17, and the effective concentration of nickel carbonyl in the atmosphere to which the wafers are exposed. Nickel carbonyl decomposes at temperatures in the range from 150° C. to 300° C. The wafers should be heated to a temperature high enough to allow for heat losses as they travel from the heater to the region where plating occurs. Nickel films of the desired thickness have been formed with an indicated temperature of about 300° C. in the heated portion of the tube, with the conveyor moving at a speed of 35 to 50 inches per minute, and with a nickel carbonyl concentration in the range from .1 to 2 percent. The operating conditions can be adjusted to control the film thickness.

The nickel on the wafers is highly pure. It does not contain phosphorus, sulfur and other contaminants which are present in nickel plated from the usual electroless plating solutions. Although a very small amount of carbon is contained in the coating, it is not harmful, and in fact may improve the solderability of the silicon.

The plated wafers are divided into semiconductor units, called dice, after the gas plating step. There are several known methods of accomplishing the dicing step. For example, the wafer may be scribed with a diamond point along spaced parallel lines running in one direction, and then scribed in a similar manner along spaced parallel lines at right angles to the first lines. The scribed lines thus define square or rectangular semiconductor units. The wafer may then be broken along the scribed lines by applying pressure to it so as to flex the wafer. The wafers can also be divided by ultrasonic cutting techniques, by sawing, or by masked etching techniques, all of which are known in the art.

The individual semiconductor units are assembled with connector structures and solder material, and the assemblies are heated to solder the connectors to the silicon of the semiconductor units. A typical soldered assembly is shown in FIG. 4 by way of example. In this assembly, the semiconductor unit 21 is soldered on its bottom side to a metal member 22 which may be the base support structure of a semiconductor device. The unit 21 is soldered on its other side to a metal disk 23 which in turn is soldered to a resilient lead member 24. For some applications, the members 22, 23 and 24 are made of copper because of its relatively high heat conductivity. However, other metals may be used. Sometimes the disk 24 is made of molybdenum which has a thermal expansion characteristic similar to that of the silicon semiconductor unit 21.

The solder at 25, 26 and 27 is originally in the form of disks. Any of the solder materials commonly used in the semiconductor industry are satisfactory. Typical solder compositions for semiconductors are 60% Pb-40% Sn, and 95% Pb-5% Sn. The solder bonds satisfactorily to the silicon of the unit 21 when the assemblies are heated to a temperature in the range of 430° C. to 490° C. in a reducing or inert atmosphere. The film of nickel on the silicon material is so thin that it does not serve a structural function in the assembly. It acts as a wetting agent during the soldering step so that the solder wets and bonds to the silicon material. The resulting connections exhibit ohmic behavior.

The reverse current of silicon rectifiers fabricated in accordance with the invention has consistently been an order of magnitude lower than that of rectifiers made by standard wet chemical processing. Typical rectifiers made by the nickel carbonyl plating process described herein had reverse current in the range from 0 to 100 milliamps (average 30–50 ma.) at 40 volts, whereas rectifiers made using wet plating steps had reverse current in the range from 0 to 1000 milliamps (average 300 ma.) at 40 volts. The improvement for the carbonyl plated units can be attributed to the purity of the nickel and the freedom from absorbed contaminants which are likely to result from wet plating steps.

Thus, the invention provides a simplified method for making electrical connections to semiconductor elements, and is particularly useful in the fabrication of silicon rectifiers and diodes. Since several wet chemical plating steps are eliminated, the cost of manufacturing the devices is reduced significantly. The gas plated nickel is highly pure, and this helps to improve the characteristics of the final devices.

I claim:

1. A process for making an ohmic connection between a semiconductor element of silicon and a metal member, including the steps of, treating a silicon semiconductor element to remove oxides and silicates by at least one treatment selected from the group consisting of sand blasting and washing in a solution containing hydrofluoric acid, depositing a flash film of nickel from gaseous nickel carbonyl on a surface of the semiconductor element to a thickness of between 1 and 20 microinches, subsequently dividing said element into semiconductor die units, assembling individual ones of said die units with solder and metal connector members, and soldering said members to said die units by heating and then cooling the assemblies to melt and solidify the solder with said nickel plating being sufficiently thin to act as a wetting agent for the solder to facilitate soldering to the silicon die units.

2. A process for making an ohmic connection between a semiconductor element of silicon and a metal member, including the steps of, treating a semiconductor element to remove oxides and silicates from at least one surface of the semiconductor element by at least one treatment selected from the group consisting of sand blasting and washing in a solution containing hydrofluoric acid, exposing said semiconductor element in a confined space to a gaseous mixture of nickel carbonyl and a gas which is inert with respect to nickel carbonyl and at the same time maintaining said semiconductor element at a temperature above the minimum decomposition temperature of nickel carbonyl, depositing a film of nickel from said nickel carbonyl gas onto the treated surface of the semiconductor element to a thickness of between 1 and 20 microinches, subsequently dividing said element into semiconductor die units, assembling individual ones of said die units with solder and metal connector members, and soldering said members to said die units by heating and then cooling the assemblies to melt and solidify the solder with said nickel plating being sufficiently thin to act as a wetting agent for the solder to facilitate soldering to the silicon die units.

3. A process for making an ohmic connection between semiconductor devices and metal connector members, including the steps of, treating a silicon semiconductor wafer to remove oxides and silicates by at least one treatment selected from the group consisting of sand blasting and washing in a solution containing hydrofluoric acid, passing said wafer through a gas plating tube having a heating zone in which gas inert with respect to nickel carbonyl flows to a central outlet from the tube in the direction of wafer travel and having a plating zone in which a mixture of nickel carbonyl vapors and a gas inert with respect to nickel carbonyl flows to said outlet opposite the direction of wafer travel, heating said wafer in said heating zone to a temperature above the minimum decomposition temperature of nickel carbonyl to cause decomposition of nickel carbonyl and the deposition of a flash plating of nickel from said nickel carbonyl wafer to a thickness of between 1 and 20 microinches as said wafer passes through said plating zone, subsequently dividing said wafer into semiconductor die units, assembling individual ones of said die units with solder and metal connector members, and soldering said members to said die units by heating and then cooling the assemblies to melt and solidify the solder with said nickel plating being sufficiently thin to act as a wetting agent for the solder to facilitate soldering to the silicon die units.

4. A process for making an ohmic connection to semiconductor devices, including the steps of, treating a silicon semiconductor wafer to remove oxides and silicates by at least one treatment selected from the group consisting of sand blasting and washing in a solution containing hydrofluoric acid, passing said wafer through a gas plating tube having a heating zone in which a gas inert with respect to nickel carbonyl flows to a central outlet from the tube in the direction of wafer travel and having a plating zone in which a mixture of nickel carbonyl vapors and a gas inert with respect to nickel carbonyl flows to said outlet opposite the direction of wafer travel, heating said wafer in said heating zone to a temperature above the minimum decomposition temperature of nickel carbonyl to cause decomposition of nickel carbonyl and the deposition of a flash plating of nickel from said nickel carbonyl wafer to a thickness of between 1 and 20 microinches, as said wafer passes through said plating zone, subsequently dividing said wafer into semiconductor die units, assembling individual ones of said die units with solder and with metal connector members, and soldering said metal connector members to said die units by heating and then cooling the assemblies to melt and solidify the solder with said nickel plating being sufficiently thin to act as a wetting agent for the solder to facilitate said soldering of said metal connector members to the silicon die unit.

5. A process for making ohmic connections to semiconductor devices which comprises, washing a plurality of silicon wafers in a solution containing hydrofluoric acid, passing said wafers through a gas plating tube having a heating zone in which an inert gas flows to a central outlet from the tube in the direction of wafer travel and a plating zone in which mixture of nickel carbonyl vapors and an inert gas flows to said outlet opposite the direction of wafer travel, heating said wafers in said heating zone to a temperature above the minimum decomposition temperature of nickel carbonyl to cause decomposition of nickel carbonyl and the deposition of a flash plating of nickel on said wafers as said wafers pass through said plating zone, subsequently dividing said wafers into semiconductor die units, assembling individual ones of said die units with solder and metal connector members, and soldering said members to said die units by heating and then cooling the assemblies to melt and solidify the solder with said nickel plating being sufficiently thin to act as a wetting agent for the solder to facilitate soldering to the silicon die units .

6. A continuous process performed in a confined space for preparing a silicon semiconductor element, from which surface contaminants have been removed by at least one treatment selected from the group consisting of sand blasting and washing in a solution containing hydrofluoric acid, so as to facilitate the making of an ohmic connection of a metal member to a face of the element, said process including, passing the semiconductor element entirely through a confined space having a heating zone and a plating zone, in consecutive order in said space, introducing gaseous nickel carbonyl into the confined space so that it flows through the plating zone and out of the confined space, introducing into the confined space a gas inert with respect to nickel carbonyl so that said inert gas flows through the heating zone and out of the confined space to define a region of flow of gaseous nickel carbonyl solely within the plating zone, heating the semiconductor element within the heating zone to the decomposition temperature of nickel carbonyl, passing gaseous nickel carbonyl over the heated semiconductor element in said plating zone, with said heated element decomposing said gaseous nickel carbonyl and causing a thin film of nickel from said decomposed nickel carbonyl to deposit on the face of the element, subsequently dividing said element into semiconductor die units, assembling individual ones of said die units with solder and metal connector members, and soldering said members to said die units by heating and then cooling the assemblies to melt and solidify the solder with said nickel plating being sufficiently thin to act as a wetting agent for the solder to facilitate soldering to the silicon die units.

7. A continuous process performed in a confined space for preparing a silicon semiconductor element, from which surface contaminants have been removed by washing in a solution containing hydrofluoric acid, so as to facilitate the making of an ohmic connection of a metal member to a face of the element, said process including, passing the semiconductor element entirely through a confined space having a heating zone and a plating zone, in consecutive order in said space, introducing gaseous nickel carbonyl into the confined space so that it flows through the plating zone and out of the confined space, introducing into the confined space a gas inert with respect to nickel carbonyl so that said inert gas flows through the heating zone and out of the confined space to define a region of flow of gaseous nickel carbonyl solely within the plating zone, heating the semiconductor element within the heating zone to the decomposition temperature of nickel carbonyl, passing gaseous nickel carbonyl over the heated semiconductor element in said plating zone, with said heated element decomposing said gaseous nickel carbonyl and causing a thin film of nickel from said decomposed nickel carbonyl to deposit on the face of the element, said thin film of nickel being between 1 and 20 microinches in thickness and subsequently dividing said element into semiconductor die units, assembling individual ones of said die units with solder and metal connector members, and soldering said members to said die units by heating and then cooling the assemblies to melt and solidify the solder with said nickel plating being sufficiently thin to act as a wetting agent for the solder to facilitate soldering to the silicon die units.

References Cited by the Examiner

UNITED STATES PATENTS

| | | | |
|---|---|---|---|
| 2,793,420 | 5/1957 | Johnston et al. | 29—155.5 |
| 2,877,138 | 3/1959 | Vodonik. | |
| 2,913,357 | 11/1959 | Ostrofsky et al. | |
| 3,046,176 | 7/1962 | Bosenberg | 29—155.5 XR |
| 3,071,854 | 1/1963 | Pighini | 29—492 XR |
| 3,146,514 | 9/1964 | Knau et al. | 29—492 XR |

JOHN F. CAMPBELL, *Primary Examiner.*

WHITMORE A. WILTZ, P. M. COHEN, *Examiners.*